United States Patent
Lu et al.

(10) Patent No.: US 7,746,134 B1
(45) Date of Patent: Jun. 29, 2010

(54) DIGITALLY CONTROLLED DELAY-LOCKED LOOPS

(75) Inventors: Sean Shau-Tu Lu, San Jose, CA (US);
Chiakang Sung, Milpitas, CA (US);
Joseph Huang, Morgan Hill, CA (US);
Yan Chong, San Jose, CA (US)

(73) Assignee: Altera Corporation, San Jose, CA (US)

( * ) Notice: Subject to any disclaimer, the term of this patent is extended or adjusted under 35 U.S.C. 154(b) by 72 days.

(21) Appl. No.: 11/737,116

(22) Filed: Apr. 18, 2007

(51) Int. Cl.
*H03L 7/06* (2006.01)
(52) U.S. Cl. .................................... 327/158; 327/149
(58) Field of Classification Search ................... None
See application file for complete search history.

(56) References Cited

U.S. PATENT DOCUMENTS

| | | | |
|---|---|---|---|
| 6,125,157 A | 9/2000 | Donnelly et al. | |
| 6,215,726 B1 * | 4/2001 | Kubo | 365/233.17 |
| 6,272,653 B1 * | 8/2001 | Amstutz | 714/724 |
| 6,337,590 B1 | 1/2002 | Millar | |
| 6,346,837 B1 | 2/2002 | Shibayama | |
| 6,356,117 B1 * | 3/2002 | Sutherland et al. | 326/93 |
| 6,388,482 B1 | 5/2002 | Schnell et al. | |
| 6,549,041 B2 * | 4/2003 | Waldrop | 327/5 |
| 6,642,762 B2 * | 11/2003 | von Kaenel | 327/158 |
| 6,809,555 B1 * | 10/2004 | Nguyen | 327/3 |
| 7,016,451 B2 | 3/2006 | Harrison | |
| 7,161,391 B2 * | 1/2007 | Lin | 327/5 |
| 7,279,946 B2 * | 10/2007 | Minzoni | 327/158 |
| 7,319,728 B2 | 1/2008 | Bell et al. | |
| 7,324,621 B2 | 1/2008 | Song | |
| 7,372,310 B2 | 5/2008 | Lee | |
| 2006/0029175 A1 * | 2/2006 | Schnarr | 375/376 |
| 2006/0145741 A1 | 7/2006 | Panpalia et al. | |
| 2006/0164139 A1 * | 7/2006 | Chong et al. | 327/158 |
| 2007/0046348 A1 | 3/2007 | Liu et al. | |

* cited by examiner

*Primary Examiner*—Cassandra Cox
(74) *Attorney, Agent, or Firm*—Steven J. Cahill

(57) ABSTRACT

Digitally controlled delay-locked loops can have a phase detector, control logic, and a delay chain. The control logic generates digital signals in response to an output signal of the phase detector. The delay chain generates a delay that varies in response to the digital signals. In some embodiments, the control logic maintains logic states of the digital signals constant in response to an enable signal to maintain the delay of the delay chain constant in a lock mode of the digitally controlled delay-locked loop. In other embodiments, the delay of the delay chain varies by a discrete time period in response to a change in logic states of the digital signals, and the maximum phase error between a phase of the reference clock signal and a phase of the feedback clock signal is less than the discrete time period when the digitally controlled delay-locked loop is in a lock mode.

18 Claims, 8 Drawing Sheets

DIGITALLY CONTROLLED DELAY-LOCKED LOOPS

BACKGROUND OF THE INVENTION

The present invention relates to electronic circuits, and more particularly, to digitally controlled delay-locked loop circuits.

Digital delay-locked loop circuits typically maintain a phase relationship between an input reference clock signal and a feedback clock signal. Many digital delay-locked loops generate a significant phase error between the feedback clock signal and the input reference clock signal. In addition, many digital delay locked loops generate an undesirable amount of jitter in the feedback clock signal.

Therefore, it would be desirable to provide a digital delay-lock loop that can generate a clock signal having reduced jitter and a reduced phase error relative to an input reference clock signal.

BRIEF SUMMARY OF THE INVENTION

The present invention includes methods and systems for digitally controlled delay-locked loops. According to some embodiments of the present invention, the digitally controlled delay-locked loops have a phase detector, control logic, and a delay chain. The control logic generates digital signals in response to an output signal of the phase detector. The delay chain generates a delay that varies in response to the digital signals from the control logic.

According to some embodiments of the present invention, the control logic maintains logic states of the digital signals constant in response to an enable signal to maintain the delay of the delay chain constant in a lock mode of the digitally controlled delay-locked loop.

According to other embodiments of the present invention, the delay of the delay chain varies by a discrete time period in response to a change in logic states of the digital signals. The maximum phase error between a phase of the reference clock signal and a phase of a feedback clock signal is less than the discrete time period when the digitally controlled delay-locked loop is in a lock mode.

Other objects, features, and advantages of the present invention will become apparent upon consideration of the following detailed description and the accompanying drawings.

DETAILED DESCRIPTION OF THE INVENTION

Figure 1:
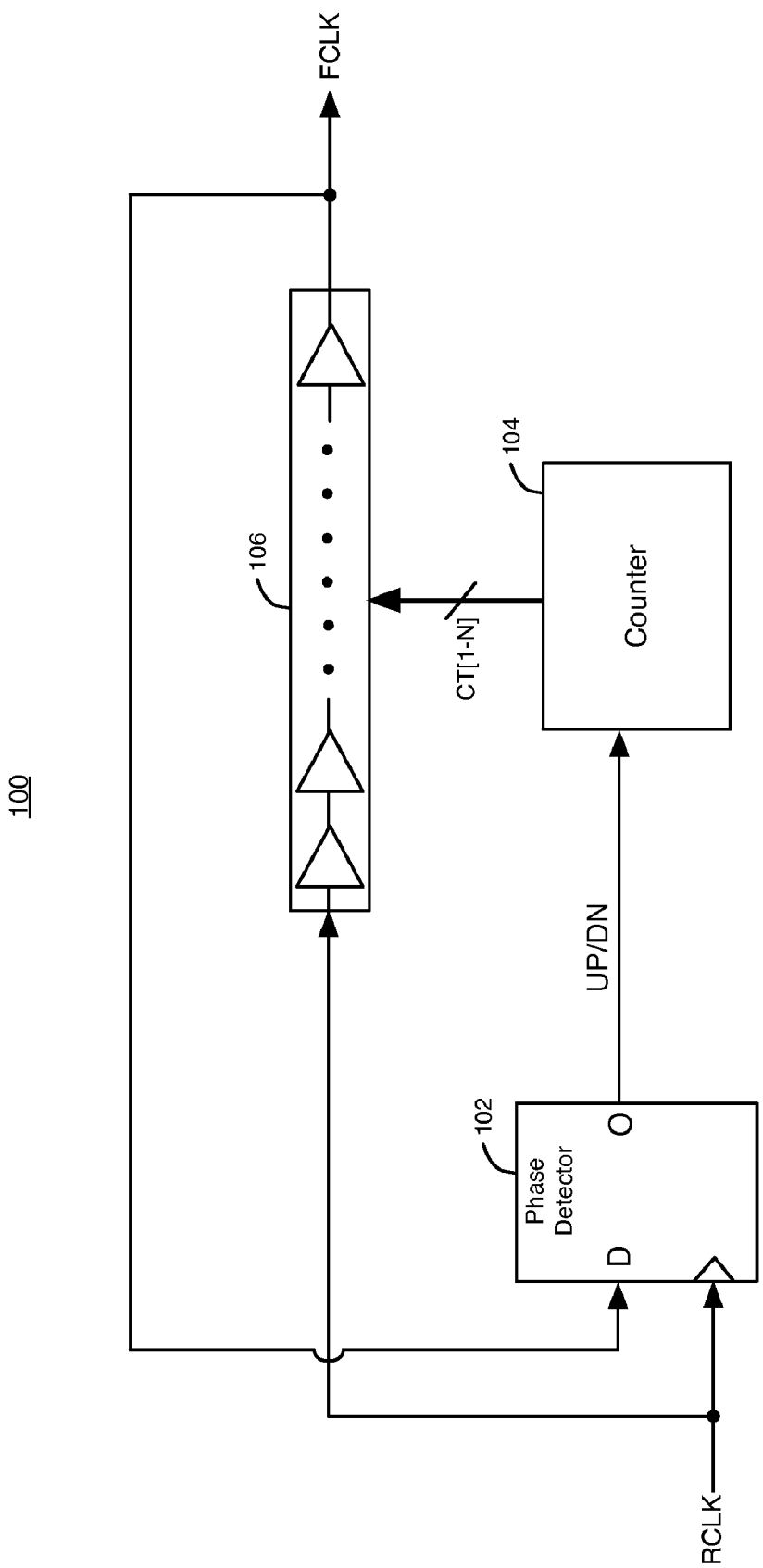
FIG. 1 illustrates a digitally controlled delay-locked loop (DLL) circuit.

FIG. 1 illustrates an embodiment of a digital delay-locked loop (DLL) circuit 100. DLL 100 includes phase detector 102, counter 104, and delay chain 106. Delay chain 106 receives a periodic reference clock signal (RCLK) at an input. Delay chain 106 delays RCLK to generate a periodic feedback clock signal (FCLK) at an output.

Phase detector 102 receives the reference clock signal RCLK at a clock input. The feedback clock signal FCLK from delay chain 106 is fed back to a D input of phase detector 102. Phase detector 102 compares the phases of the reference clock signal RCLK and the feedback clock signal FCLK to generate a digital UP/DN signal.

The UP/DN signal is transmitted to an input of counter circuit 104. Counter 104 generates a set of digital count signals CT[1-N] that are transmitted to delay chain 106. When the phase of FCLK is ahead of the phase of RCLK, phase detector 102 generates a logic high on the UP/DN signal to slow down the phase of the FCLK signal. When the phase of FCLK is behind of the phase of RCLK, phase detector 102 generates a logic low on the UP/DN signal to speed up the phase of the FCLK signal.

Figure 2:
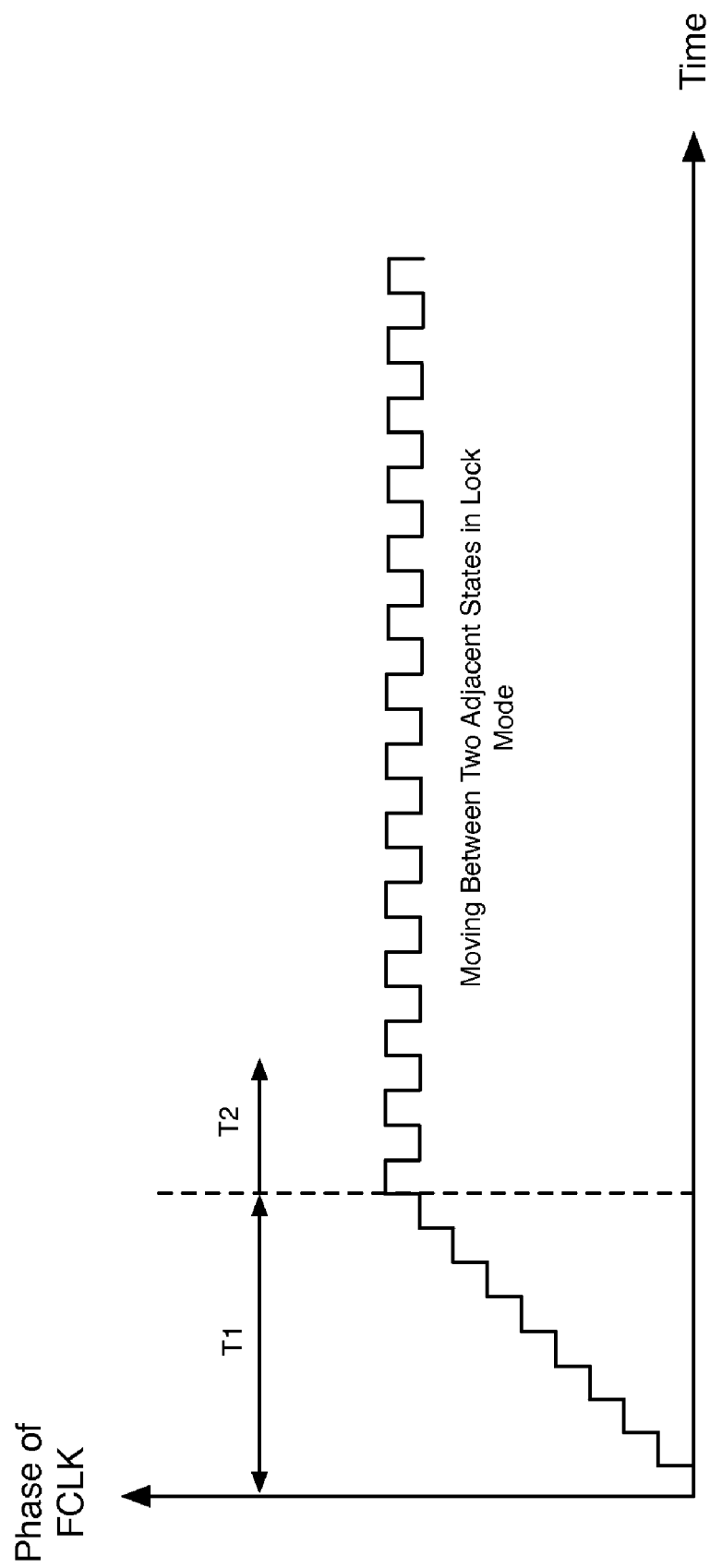
FIG. 2 is a graph that illustrates an example how the phase of the feedback clock signal can change over time in the DLL of FIG. 1.

The delay of delay chain 106 can only be adjusted in discrete increments of time. This principle is illustrated in FIG. 2. FIG. 2 is a graph that illustrates an example of how the phase of the feedback clock signal FCLK can change discretely over time in DLL 100. Initially, the phase of FCLK lags behind of the phase of RCLK. DLL 100 increases the phase of FCLK in discrete increments of time during time period T1 in FIG. 2.

In the example of FIG. 2, none of the possible logic states of the digital count signals CT[1-N] causes the phase of FCLK to exactly match the phase of RCLK. Therefore, the digital count signals CT[1-N] toggle back and forth between the two logic states that cause the phase of FCLK to most closely match the phase of RCLK. As a result, the phase of FCLK switches between two adjacent discrete phase states while DLL 100 is in lock mode during time period T2, as shown in FIG. 2. The switching of the phase of FCLK between two adjacent discrete phase states causes FCLK to have jitter, which is undesirable.

Figure 3:
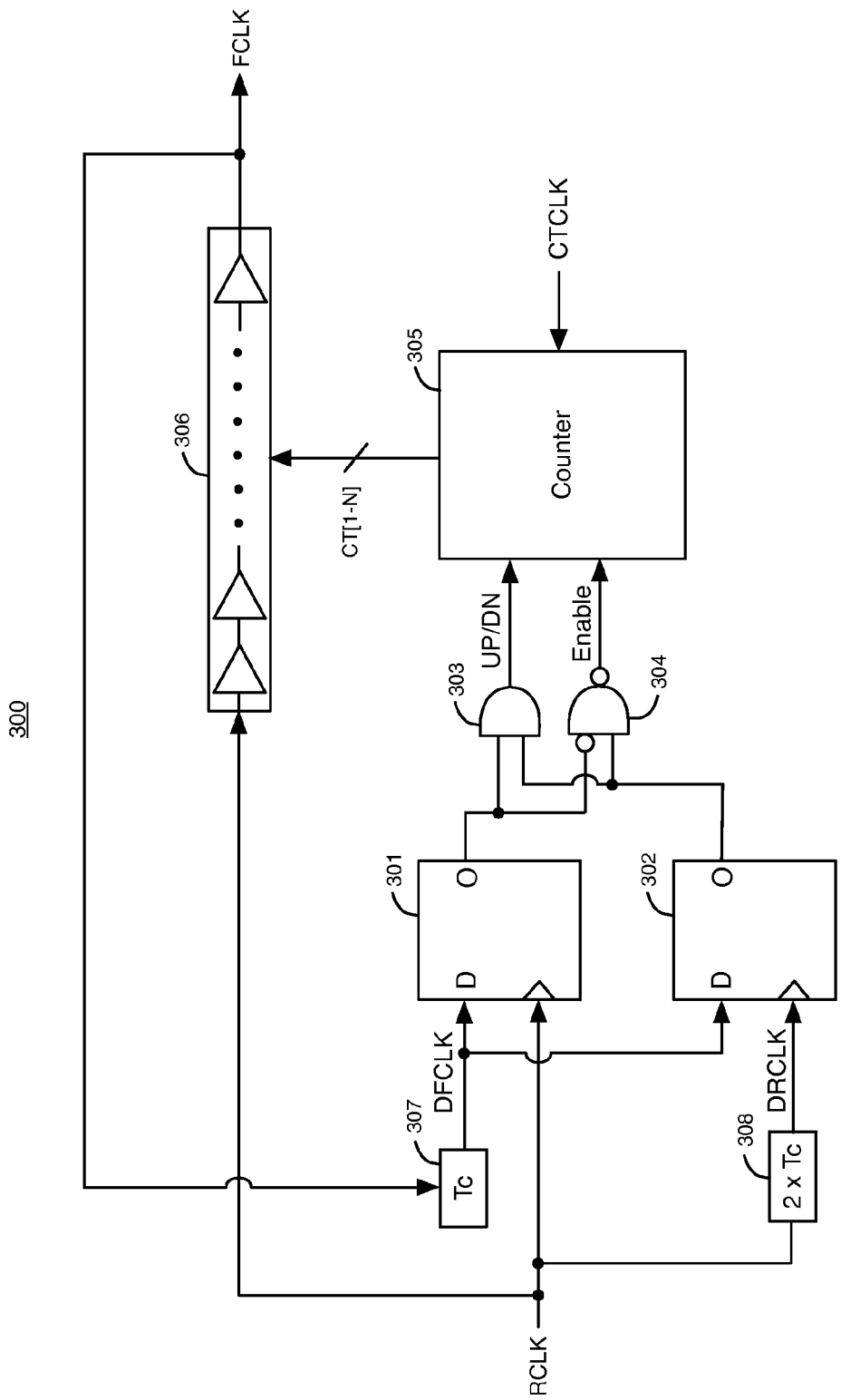
FIG. 3 illustrates a digitally controlled delay-locked loop (DLL) that reduces the phase error between the reference and feedback clock signals, according to an embodiment of the present invention.

According to some embodiments of the present invention, the phase error between the reference clock signal RCLK and the feedback clock signal FCLK can be decreased below the worst case phase error generated by DLL 100. FIG. 3 illustrates a digitally controlled delay-locked loop (DLL) 300 that reduces the phase error between the reference and feedback clock signals, according to an embodiment of the present invention.

DLL 300 includes phase detectors 301 and 302, AND gate 303, NAND gate 304, counter circuit 305, delay chain 306, delay circuit 307, and delay circuit 308. Delay chain 306 receives a periodic reference clock signal RCLK at an input terminal. Delay chain 306 delays reference clock signal RCLK to generate a periodic feedback clock signal FCLK. The feedback clock signal FCLK is the output clock signal of DLL 300.

Counter circuit 305 is an up/down counter circuit that generates digital count signals CT[1-N]. The count signals are transmitted to delay chain 306. The count signals CT[1-N] control the delay of delay units in delay chain 306.

And gate 303 generates an UP/DN signal that is transmitted to a first input of counter 305. NAND gate 304 generates an Enable signal that is transmitted to a second input of counter 305. Counter 305 receives a counter clock signal CTCLK at a third input. Counter 305 varies the binary value of the count signals CT[1-N] in response to the counter clock signal CTCLK, the UP/DN signal, and the Enable signal. The UP/DN signal determines whether counter 305 increases or decreases the binary value of digital count signals CT[1-N].

Delay chain 306 generates a discrete phase delay in the feedback clock signal FCLK in response to each binary value of the count signals CT[1-N]. The time period between two adjacent discrete phase states in FCLK that can be generated by delay chain 306 is referred to as Td. When the binary value of the count signals CT[1-N] is increased by one, the delay that delay chain 306 provides to FCLK increases by a discrete amount of time equal to Td. When the binary value of the count signals CT[1-N] is decreased by one, the delay that delay chain 306 provides to FCLK decreases by a discrete amount of time equal to Td. According to some embodiments of the present invention, the time period Td between each two adjacent discrete phase states of FCLK that can be generated by delay chain 306 is the same.

Counter 305 acts as the control logic of DLL 300. According to alternative embodiments of the present invention, counter 305 is replaced with a shift register that acts as the control logic. The shift register generates digital signals that control the delay of delay chain 306 in response to the UP/DN, CTCLK, and Enable signals. According to further embodiments of the present invention, counter 305 is replaced with a state machine that acts as the control logic. The state machine generates digital signals for controlling the delay of delay chain 306 in response to the UP/DN, CTCLK, and Enable signals.

Figure 4A:
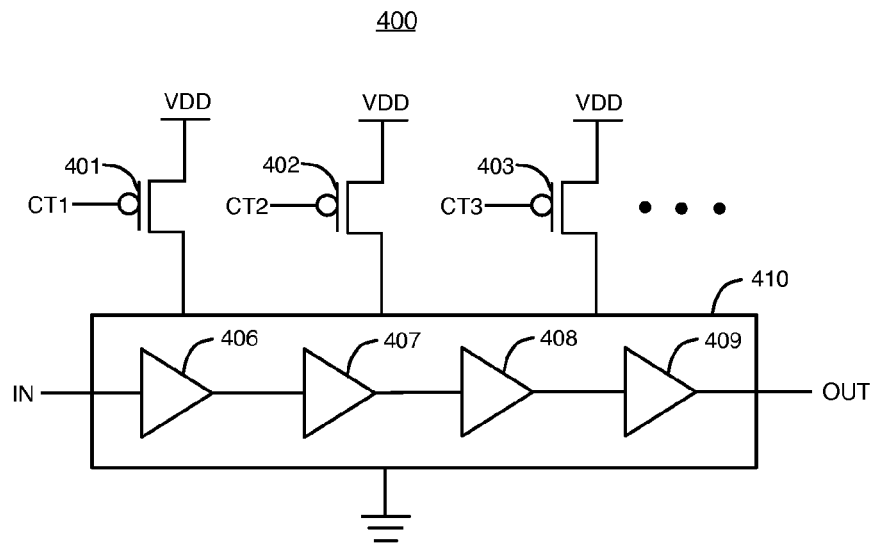
FIG. 4A illustrates an example of one of the delay units in the delay chain shown in FIG. 3, according to an embodiment of the present invention.

Delay chain 306 can have any suitable number of delay units. The delay units in delay chain 306 can, for example, be coupled together in series. Delay unit 400 of FIG. 4A is an example of the delay units in delay chain 306, according to an embodiment of the present invention.

Delay unit 400 includes a set of p-channel MOS field-effect transistors (PMOSFETs), such as transistors 401-403. Each of the transistors 401-403, etc. receives one of the count signals CT[1-N] at its gate terminal. According to an alternative embodiment of FIG. 4A, PMOSFETs 401-403, etc. can be replaced with n-channel MOS field-effect transistors if the count signals CT[1-N] are inverted before they are transmitted to the gates of the NMOSFETs.

Delay unit 400 also includes a group 410 of non-inverting buffer circuits that are coupled together in series, including non-inverting buffer circuits 406, 407, 408, and 409. Although 4 buffer circuits 406-409 are shown in FIG. 4A as an example, delay unit 400 can have any suitable number of buffer circuits. Each of non-inverting buffer circuits 406-409 can include, for example, two inverter circuits coupled together in series. Buffer circuits 406-409 in group 410 delay the signal received at the IN terminal to generate a delayed signal at the OUT terminal.

The source terminals of PMOS transistors 401-403, etc. are coupled to receive a supply voltage VDD. The drain terminals of PMOS transistors 401-403, etc. are coupled to the buffer circuits in group 410. Transistors 401-403, etc. control the current supplied to the buffer circuits in group 410. Transistors 401-403, etc. are referred to as current starving transistors, because they can increase or reduce the current flow to the buffer circuits in group 410 to adjust the delay of delay unit 400.

The current starving transistors in delay unit 400 can have binary weighted width-to-length (W/L) channel ratios. For example, current starving transistors in delay unit 400 can have the following W/L channel ratios. The W/L channel ratio of transistor 401 equals X, the W/L channel ratio of transistor 402 equals X/2, and the W/L channel ratio of transistor 403 equals X/4, where X can represent any suitable channel size. In this example, turning on transistor 401 causes more current to flow to the buffer circuits in group 410 than turning on transistor 402 or 403.

In general, the most significant bits of the count signals CT[1-N] from counter 305 are transmitted to the gates of the current starving transistors that have the largest W/L channel ratios, and the least significant bits of the count signals are transmitted to the gates of the current starving transistors that have the smallest W/L channel ratios. As a result, the current starving PMOS transistors 401-403, etc. send more current to the buffer circuits in group 410 when the binary value of the count signals decreases. PMOS transistors 401-403 send less current to the buffer circuits in group 410 when the binary value of the count signals increases.

While the UP/DN signal is a logic high, counter 305 increases the binary value of the count signals CT[1-N], causing PMOSFETs 401-403, etc. to send less current to the buffer circuits in group 410. When the current flow to the buffer circuits in group 410 decreases, the buffer circuits switch the logic states of their output signals more slowly, and the delay of signals passing from the IN terminal to the OUT terminal increases. As a result, the delay of each of the delay units in delay chain 306 increases, and the delay provided to FCLK increases when the UP/DN signal is high.

While the UP/DN signal is a logic low, counter 305 decreases the binary value of the count signals CT[1-N], causing PMOSFETs 401-403, etc. to send more current to the buffer circuits in group 410. When the current flow to the buffer circuits in group 410 increases, the buffer circuits switch the logic states of their output signals more quickly, and the delay of signals passing from the IN terminal to the OUT terminal decreases. As a result, the delay of each of the delay units in delay chain 306 decreases, and the delay provided to FCLK decreases when the UP/DN signal is low.

Figure 4B:
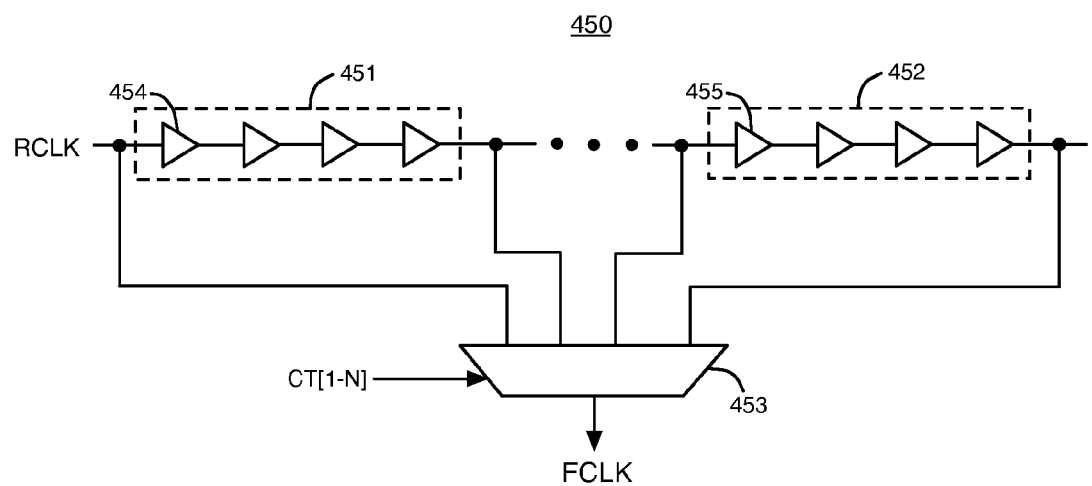
FIG. 4B illustrates another example of the delay chain shown in FIG. 3, according to another embodiment of the present invention.

FIG. 4B illustrates another example of delay chain 306, according to another embodiment of the present invention. Delay chain 450 of FIG. 4B includes several delay units. Two of the delay units 451 and 452 are shown in FIG. 4B, although delay chain 450 typically has several more delay units.

Each of the delay units in delay chain 450, including delay units 451-452, has four non-inverting buffer circuits that are coupled together in series, although any suitable number of buffer circuits can be used. For example, delay unit 451 includes non-inverting buffer circuit 454, and delay unit 452 includes non-inverting buffer circuit 455. Each of the non-inverting buffer circuits in delay chain 450 can include, for example, two inverter circuits coupled together in series.

The output signal of each of the delay units in delay chain 450 is transmitted to an input of multiplexer 453. Also, the input signal RCLK of delay chain 450 is transmitted to an input of multiplexer 453. Multiplexer 453 selects a signal at one of its inputs in response to the logic states of the count signals CT[1-N] from counter 305. Multiplexer 453 transmits the selected input signal to its output terminal as the feedback clock signal FCLK.

Each time that counter 305 decreases the binary value of the count signals CT[1-N] by one, multiplexer 453 selects the output signal of a previous delay unit to decrease the delay provided to FCLK relative to RCLK. Each time that counter 305 increases the binary value of the count signals CT[1-N] by one, multiplexer 453 selects the output signal of the next delay unit to increase the delay provided to FCLK relative to RCLK.

The feedback clock signal FCLK is transmitted to an input of delay circuit 307. Delay circuit 307 delays the feedback clock signal FCLK by a time period Tc to generate a delayed feedback clock signal DFCLK.

First phase detector 301 receives the delayed feedback clock signal DFCLK at its D input terminal. Phase detector 301 receives the periodic reference clock signal RCLK at its clock input terminal. Phase detector 301 generates an output signal at its O output terminal.

The reference clock signal RCLK is also transmitted to an input of a second delay circuit 308. Second delay circuit 308 delays the reference clock signal RCLK by a time period equal to 2×Tc to generate a delayed reference clock signal DRCLK. Thus, the delay of delay circuit 308 is twice the delay of delay circuit 307.

Second phase detector 302 receives the delayed feedback clock signal DFCLK from delay circuit 307 at its D input terminal. Phase detector 302 receives the delayed reference clock signal DRCLK from delay circuit 308 at its clock input terminal. Phase detector 302 generates an output signal at its O output terminal. Each of the phase detectors 301 and 302 can be, for example, a D flip-flop that latches the logic state from the D input terminal to the O output terminal in response to a rising edge at its input clock terminal. According to additional embodiments, phase detectors 301 and 302 can be implemented by other types of storage or logic circuits.

AND gate 303 performs an AND Boolean logic function on the output signals from the O output terminals of phase detectors 301 and 302 to generate the UP/DN signal. Thus, the UP/DN signal is high only when both of the output signals of phase detectors 301 and 302 are high. When either of the output signals of phase detectors 301 and 302 is low, the UP/DN signal is low.

NAND gate 304 performs a NAND Boolean logic function on the output signals from the O output terminals of phase detectors 301 and 302 to generate the Enable signal. In addition, the output signal of phase detector 301 is inverted at the first input of NAND gate 304. As a result, the Enable signal is low only when the output signal of phase detector 301 is low, and the output signal of phase detector 302 is high. The truth table for the Enable output signal of NAND gate 304 is shown in Table 1.

TABLE 1

| Phase Detector 301 Output | Phase Detector 302 Output | Enable Signal |
|---|---|---|
| 0 | 0 | 1 |
| 0 | 1 | 0 |
| 1 | 0 | 1 |
| 1 | 1 | 1 |

According to additional embodiments of the present invention, AND gate 303 and NAND gate 304 can be replaced with other types of logic gates that generate appropriate logic states for the UP/DN and Enable signals at appropriate times.

The Enable signal is transmitted to a second input of counter 305. The Enable signal enables counter 305 to change the logic states of the count signals CT[1-N]. When the Enable signal is low, counter 305 maintains the logic states of the count signals CT[1-N] constant, regardless of the logic state of the UP/DN signal.

When the Enable signal is high, counter 305 increases or decreases the delay of delay chain 306, depending on the logic state of the UP/DN signal. For example, when the UP/DN signal is high, and the Enable signal is high, counter 305 causes the delay provided by delay chain 306 to increase. When the UP/DN signal is low, and the Enable signal is high, counter 305 causes the delay provided by delay chain 306 to decrease.

When both phase detectors 301 and 302 latch a logic low at their O output terminals, the phase of the feedback clock signal FCLK is lagging behind the phase of the reference clock signal RCLK. As a result, the Enable signal is set to a logic high, and the UP/DN signal is set to a logic low. In response, counter 305 causes the delay that delay chain 306 provides to FCLK to decrease.

When both phase detectors latch a logic high at their O output terminals, the phase of the feedback clock signal FCLK is leading ahead of the phase of the reference clock signal RCLK. As a result, the Enable signal is set to a logic high, and the UP/DN signal is set to a logic high. In response, counter 305 causes the delay that delay chain 306 provides to FCLK to increase.

When phase detector 301 latches a logic low at its O output, and phase detector 302 latches a logic high at its O output, the Enable signal is set to a logic low as shown in Table 1, and DLL 300 enters lock mode. When the Enable signal is low, DLL 300 is in lock mode, and counter 305 maintains the logic states and the binary value of the count signals CT[1-N] constant in their current states. When counter 305 holds the logic states of the count signals CT[1-N] constant in lock mode, the delay of delay chain 306 remains constant, and the phase of feedback clock signal FCLK remains constant. As a result, DLL 300 eliminates the jitter in the feedback clock signal FCLK that resulted from the count signals CT[1-N] moving between two adjacent discrete states in lock mode in DLL 100.

As shown in FIG. 3, delay circuit 308 delays the reference clock signal RCLK by an amount of delay equal to 2×Tc, and delay circuit 307 delays the feedback clock signal FCLK by an amount of delay equal to Tc. DLL 300 is only in lock mode under one of two conditions. DLL 300 is in lock mode when either (1) the phase of FCLK is ahead of the phase of RCLK within an amount of delay that is less than or equal to Tc, or (2) the phase of FCLK is behind the phase of RCLK within an amount of delay that is less than or equal to Tc. Therefore, the lock mode window of DLL 300 is 2×Tc.

Thus, DLL 300 is in lock mode whenever the phase of feedback clock FCLK is ahead of the phase of reference clock RCLK or behind the phase of reference clock RCLK within an amount of delay equal to Tc. DLL 300 does not exit lock mode until there is a phase difference of more than Tc between the reference clock RCLK and the feedback clock FCLK. Tc is the maximum phase error between RCLK and FCLK in DLL 300.

Figure 5:
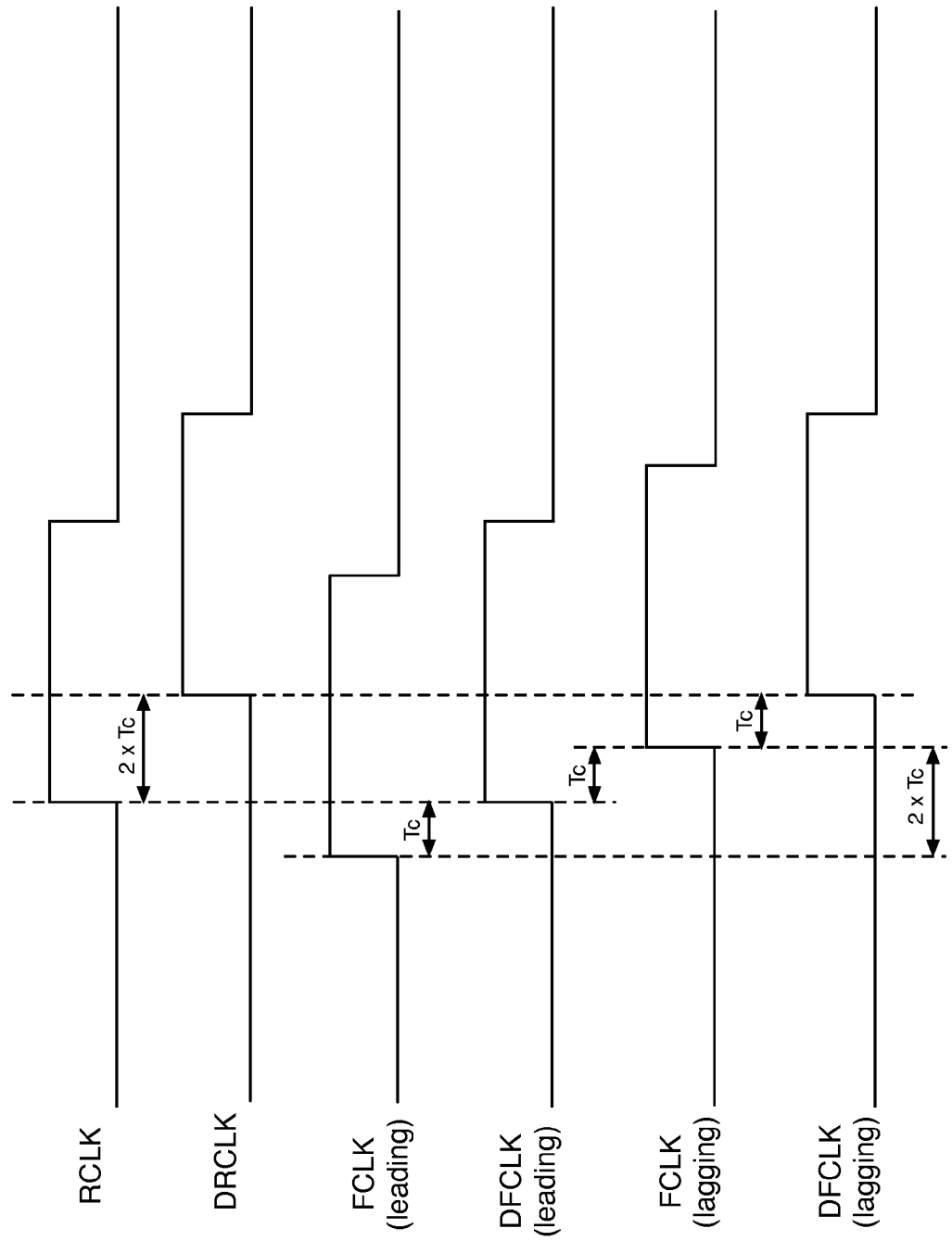
FIG. 5 graphically illustrates the phase relationships between various signals in the delay-locked loop (DLL) of FIG. 3.

FIG. 5 graphically illustrates the phase relationships between various signals in DLL 300. As shown in FIG. 5, delay circuit 308 causes the phase difference between RCLK and DRCLK to be equal to 2×Tc, and delay circuit 307 causes the phase difference between FCLK and DFCLK to be equal to Tc. The maximum phase error (i.e., the maximum difference in phase) between FCLK and RCLK in lock mode equals Tc. Thus, DLL 300 is in lock mode when the difference between the phases of FCLK and RCLK is less than or equal to Tc. The lock window for DLL 300 equals 2×Tc, as shown at the bottom of FIG. 5.

If delay Tc is less than 0.5×Td, the lock mode window (2×Tc) is less than Td. When Tc<Td/2, there is a chance that the feedback clock signal FCLK will not fall into the lock mode window, because delay chain 306 increases or decreases the phase of FCLK by one unit of delay Td whenever counter 305 changes the binary value of the count signals by 1. On the other hand, if delay Tc is larger than delay Td, the lock window (2×Tc) is larger than 2×Td, and the maximum phase error is larger than Td, which is undesirable.

According to some embodiments of the present invention, a time period is selected for Tc that is between Td/2 and Td (e.g., Td/2<Tc<Td), so that DLL 300 can reduce the phase error between FCLK and RCLK relative to the phase error generated by DLL 100. For example, if Tc is selected to be equal to 0.75×Td, the lock mode window is 1.5×Td, and the maximum phase error between FCLK and RCLK equals 0.75×Td.

If delay chain 306 has the architecture of FIG. 4B, the delay Tc of delay circuit 307 can be set to 0.75×Td, for example, by placing 3 buffers in delay circuit 307, where each of the 3 buffers has the same delay as one of the non-inverting buffers in delay units 451 and 452 (e.g., buffer 454 or 455). Selecting Tc to be equal to 0.75×Td in DLL 300 results in a 25% improvement in the maximum phase error relative to DLL 100.

According to other embodiments of the present invention, Tc is selected to be large enough so that process variations on the integrated circuit do not cause Tc to fall below Td/2.

The setup time of phase detectors 301 and 302 refers to the amount of time that the signal at the D input needs to be held at a constant logic state before a pulse at the clock input, in order for the phase detector to be able to capture the logic state at the D input and store it at the O output. The hold time of phase detectors 301 and 302 refers to the amount of time that the signal at the D input needs to be held at a constant logic state after a pulse at the clock input, in order for the phase detector to be able to capture the logic state at the D input and store it at the O output.

The setup time and hold time requirements of phase detectors 301 and 302 reduce the lock mode window of DLL 300. Phase detector 301 is hold time sensitive. If phase detector 301 has a non-zero hold time, and an edge of the delayed feedback clock signal DFCLK falls within the hold time window, phase detector 301 may not capture the state of the DFCLK signal. Usually, phase detector 301 has sufficient set up time.

Phase detector 302 is setup time sensitive. If phase detector 302 has a non-zero setup time, and an edge of the delayed feedback clock signal DFCLK falls within the setup time window, phase detector 302 may not capture the state of the DFCLK signal. Usually, phase detector 302 has sufficient hold time.

According to some embodiments of the present invention, a flip-flop having a zero hold time is used in phase detector 301, and a flip-flop having a zero setup time is used in phase detector 302, in order to improve the timing requirements and increase the lock mode window of DLL 300.

The speed of the logic circuitry of DLL 300, including phase detectors 301 and 302, AND gate 303, and NAND gate 304, limits the maximum frequency for the reference clock signal RCLK. If the frequency of RCLK is too high, DLL 300 cannot change the UP/DN and Enable signals fast enough to function properly. Also, the logic states of the count signals CT[1-N] generated by counter 305 should be updated and have stable states before the next rising edge of the reference clock signal RCLK arrives at DLL 300. Otherwise, the undetermined logic states of the count signals may cause DLL 300 to exit lock mode.

Figure 6:
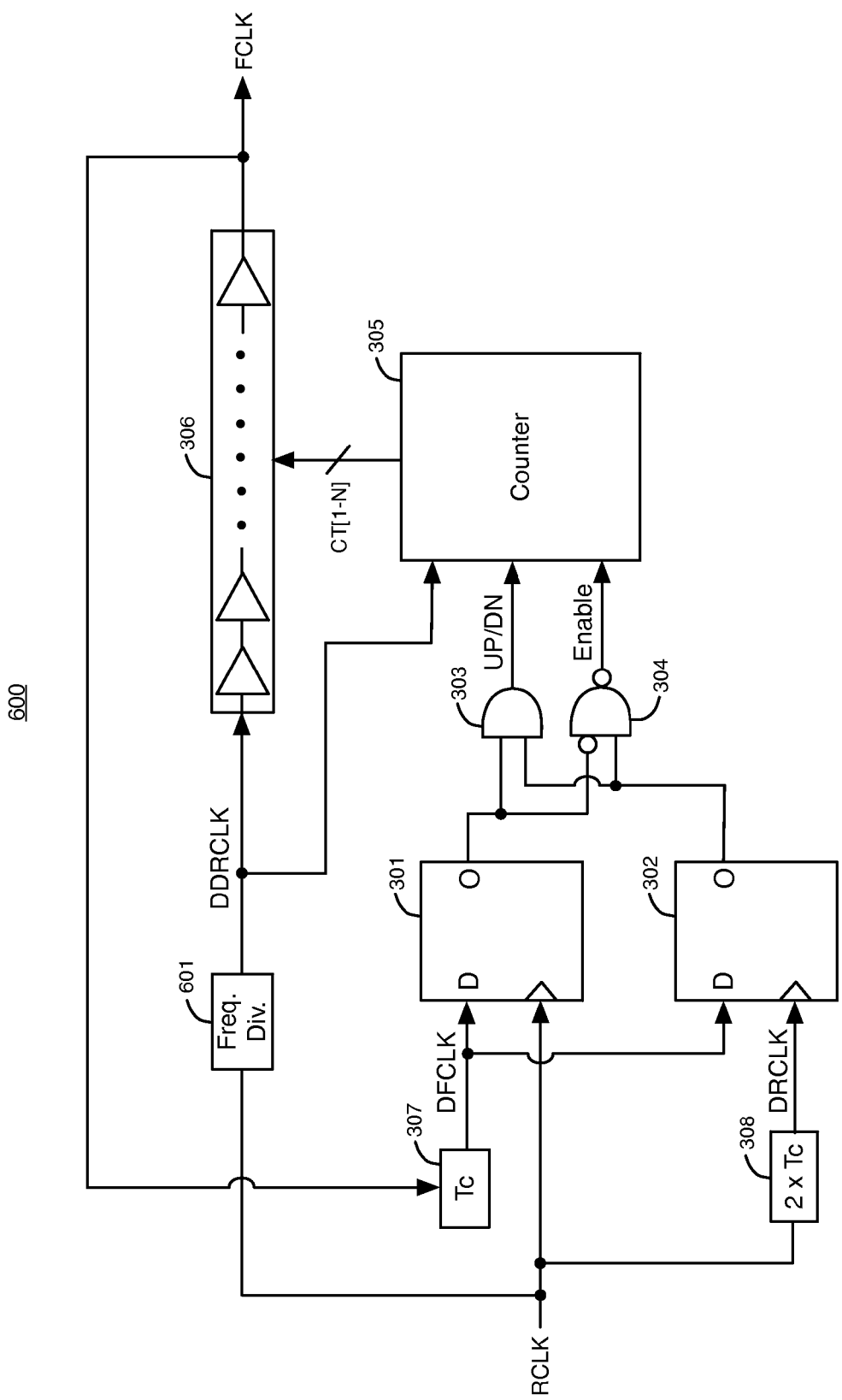
FIG. 6 illustrates an example of a digitally controlled delay-locked loop (DLL) that reduces the phase error between the reference and feedback clock signals and that can respond to higher frequency reference clock signals, according to an embodiment of the present invention.

According to another embodiment of the present invention, a frequency divider circuit is added into the delay-locked loop (DLL) so that the DLL can function properly in response to higher frequency reference clock signals RCLK. FIG. 6 illustrates an example of a digitally controlled DLL 600 that can respond to higher frequency reference clock signals, according to an embodiment of the present invention.

In DLL 600, a frequency divider circuit 601 is coupled between the input terminal that receives the reference clock signal RCLK and delay chain 306. Frequency divider circuit 601 receives the reference clock signal RCLK as an input signal. Frequency divider circuit 601 divides the frequency of reference clock signal RCLK by a frequency division ratio M to generate a divided down reference clock signal DDRCLK. The frequency of DDRCLK is a fraction of the frequency of RCLK. Frequency divider 601 can be, for example, a counter circuit. Frequency divider 601 can, for example, divide the frequency of the reference clock signal RCLK by 8, or any other suitable frequency division ratio.

The divided down reference clock signal DDRCLK is provided to an input of delay chain 306. Delay chain 306 delays the divided down reference clock signal DDRCLK to generate the feedback clock signal FCLK. The delay of delay chain 306 is determined by the logic states of the count signals CT[1-N], as described above.

Frequency divider circuit 601 provides additional time for DLL 600 to become stabilized by decreasing the frequency of the reference clock signal RCLK. The additional time provided by frequency divider 601 allows phase detectors 301 and 302 to capture the state of the DFCLK clock signal and counter 305 to adjust the count signals, even when the frequency of RCLK is higher than the maximum frequency of RCLK that can be handled by DLL 300. According to further embodiments of the present invention, the frequency division ratio of frequency divider circuit 601 can be programmed to adjust the frequency range for RCLK that DLL 600 can respond to.

The divided down reference clock signal DDRCLK is also transmitted to a clock input of counter 305. Signal DDRCLK is used to clock logic circuitry in counter 305. DDRCLK controls the rate at which counter 305 changes the binary value of the count signals CT[1-N]. Counter 305 can, for example, contain a set of flip-flops that are controlled by clock signal DDRCLK to generate the count signals. Clock signal DDRCLK in FIG. 6 replaces clock signal CTCLK in FIG. 3.

According to further embodiments of the present invention, the digitally controlled delay-locked loops can be used in a variety of applications. For example, the digitally controlled delay-locked loops can be used to generate clock signals for high-speed clocked memories, such as synchronous dynamic random access memories (SDRAMs).

Figure 7:
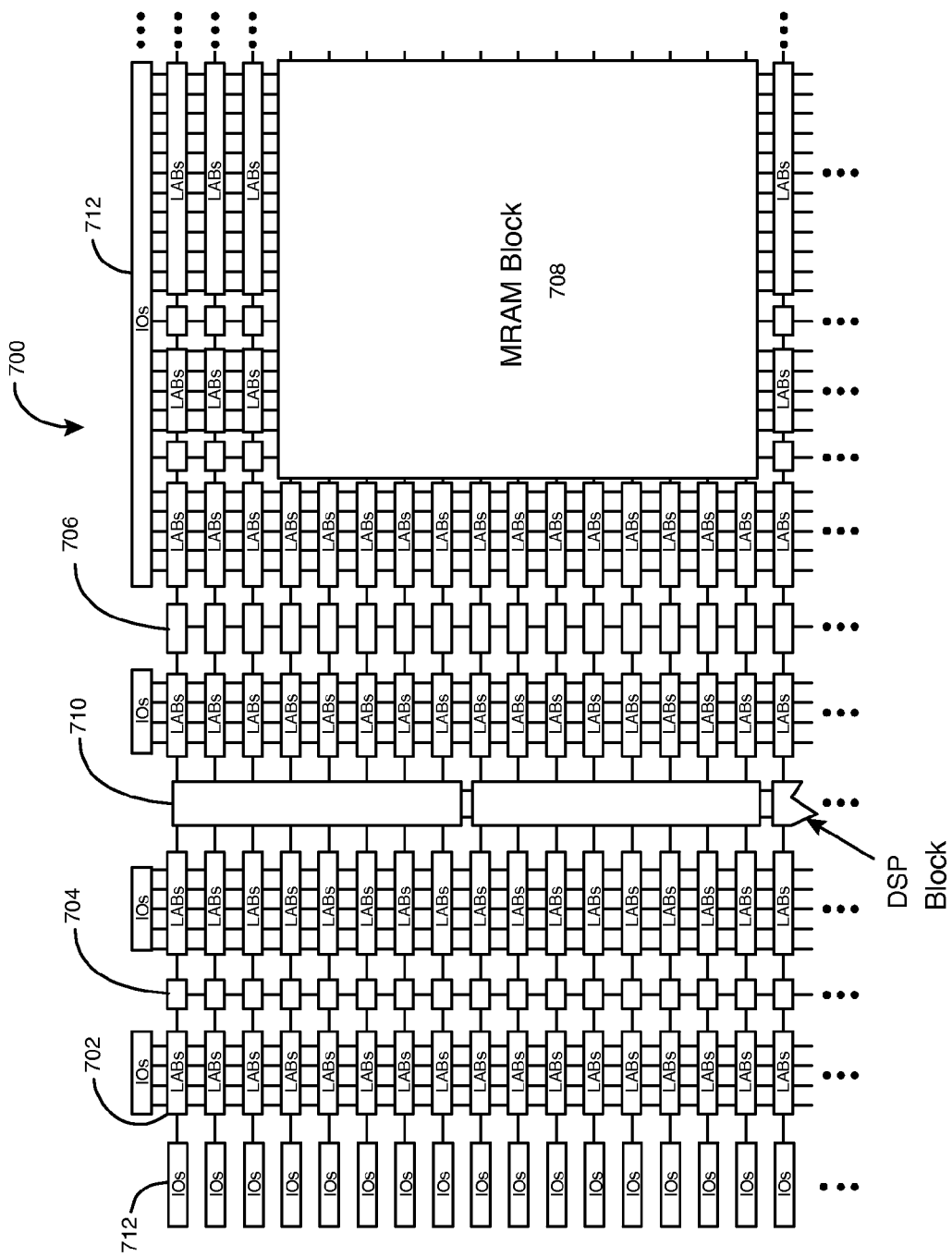
FIG. 7 is a simplified block diagram of a field programmable gate array (FPGA) that can embody the techniques of the present invention.

FIG. 7 is a simplified partial block diagram of an FPGA 700 that can include aspects of the present invention. FPGA 700 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including RAM blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. IO blocks (IOs) 712 located, in this example, around the periphery of the chip support numerous single-ended and differential input/output standards. The IO blocks 712 contain IO buffers and are typically grouped into IO banks. It is to be understood that FPGA 700 is described herein for illustrative purposes only and that the present invention can be implemented in many different types of PLDs, FPGAs, and the like.

Figure 8:
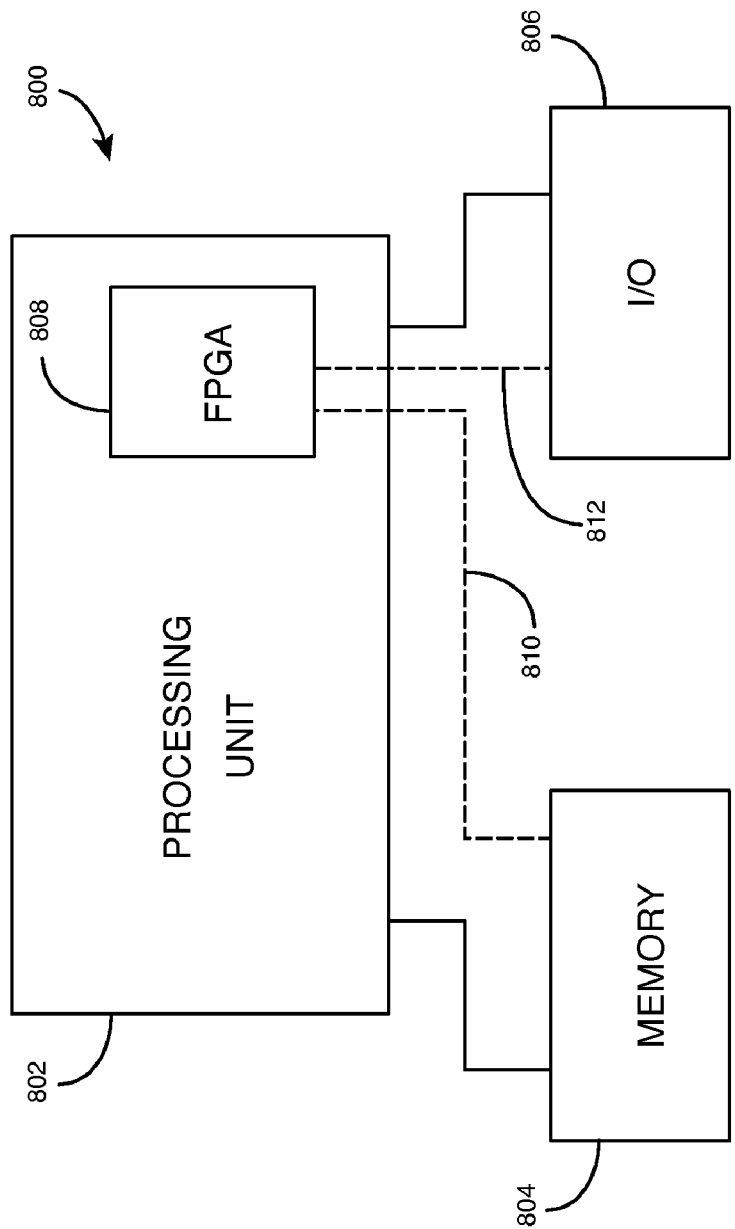
FIG. 8 is a block diagram of an electronic system that can implement embodiments of the present invention.

The present invention can also be implemented in a system that has an FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804 and an I/O unit 806 interconnected together by one or more buses. According to this exemplary embodiment, an FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor, which can be reprogrammed as needed to handle a particular computing task. Alternately, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. It is not intended to be exhaustive or to limit the present invention to the precise form disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is intended that the scope of the present invention be limited not with this detailed description, but rather by the claims appended hereto.

What is claimed is:

1. A digitally controlled delay-locked loop comprising:
a phase detector;
a counter that generates digital signals in response to an output signal of the phase detector, wherein the counter adjusts a binary value of the digital signals in one of first and second directions in response to the output signal of the phase detector;
a delay chain generating a delay that varies in response to the digital signals; and
a delay circuit that delays a feedback signal derived from the delay chain to generate a delayed feedback signal, wherein the delayed feedback signal is transmitted to an input of the phase detector, wherein the delay of the delay chain varies by a discrete time period in response to changes in logic states of the digital signals, and wherein the delay of the delay circuit is less than the discrete time period, and
wherein the counter maintains logic states of the digital signals constant in response to an enable signal to maintain the delay of the delay chain constant in a lock mode of the digitally controlled delay-locked loop, and wherein the enable signal is generated in response to the output signal of the phase detector.

2. The digitally controlled delay-locked loop defined in claim 1 wherein the digitally controlled delay-locked loop is located on a programmable logic integrated circuit.

3. A delay-locked loop comprising:
a phase detector;
control logic that generates digital signals in response to an output signal of the phase detector;
a delay chain generating a delay that varies in response to the digital signals; and
a delay circuit that delays a feedback signal derived from the delay chain to generate a delayed feedback signal, wherein the delayed feedback signal is transmitted to an input of the phase detector,
wherein the delay of the delay chain varies by a discrete time period in response to changes in logic states of the digital signals, the delay of the delay chain increases by the discrete time period in response to each of a first set of changes in the digital signals, the delay of the delay chain decreases by the discrete time period in response to each of a second set of changes in the digital signals, and the delay of the delay circuit is less than the discrete time period.

4. A digitally controlled delay-locked loop comprising:
a phase detector;

control logic that generates digital signals in response to an output signal of the phase detector;

a delay chain generating a delay that varies in response to the digital signals;

a first delay circuit that delays an input reference clock signal to generate a delayed reference clock signal, wherein the delayed reference clock signal is transmitted to the phase detector, and a lock mode window of the digitally controlled delay-locked loop is set by the delay generated by the first delay circuit;

a frequency divider circuit that divides a frequency of the input reference clock signal to generate a divided reference clock signal that is provided to an input of the delay chain; and a second delay circuit that delays a feedback clock signal from the delay chain to generate a delayed feedback signal, wherein the delayed feedback signal is transmitted to an input of the phase detector.

5. A digitally controlled delay-locked loop comprising:

a phase detector generating an output signal in response to a reference clock signal;

control logic that generates digital signals in response to the output signal of the phase detector; and a delay chain generating a delay in a feedback clock signal that varies in response to the digital signals from the control logic, wherein the delay in the feedback clock signal varies by a discrete time period in response to a change in logic states of the digital signals, and a maximum phase error between a phase of the reference clock signal and a phase of the feedback clock signal is less than the discrete time period when the digitally controlled delay-locked loop is in a lock mode, and wherein the maximum phase error between the phase of the reference clock signal and the phase of the feedback clock signal in the lock mode is at least one-half of the discrete time period.

6. The digitally controlled delay-locked loop defined in claim 5 further comprising:

a delay circuit that delays the feedback clock signal to generate a delayed feedback signal, wherein the delayed feedback signal is transmitted to an input of the phase detector, and a delay of the delay circuit is less than the discrete time period.

7. The digitally controlled delay-locked loop defined in claim 5 wherein the maximum phase error between the phase of the reference clock signal and the phase of the feedback clock signal in the lock mode is greater than one-half of the discrete time period.

8. The digitally controlled delay-locked loop defined in claim 5 wherein the control logic maintains the logic states of the digital signals constant in response to an enable signal in the lock mode to maintain the delay in the feedback clock signal constant.

9. A digitally controlled delay-locked loop comprising:

a first phase detector generating an output signal in response to a reference clock signal;

control logic that generates digital signals in response to the output signal of the first phase detector;

a delay chain generating a delay in a feedback clock signal that varies in response to the digital signals from the control logic, wherein the delay in the feedback clock signal varies by a discrete time period in response to a change in logic states of the digital signals, and a maximum phase error between a phase of the reference clock signal and a phase of the feedback clock signal is less than the discrete time period when the digitally controlled delay-locked loop is in a lock mode;

a first delay circuit that delays the feedback clock signal to generate a delayed feedback signal, wherein the delayed feedback signal is transmitted to an input of the first phase detector, and a delay of the first delay circuit is less than the discrete time period;

a second phase detector that receives the delayed feedback signal at a first input; and a second delay circuit that delays the reference clock signal to generate a delayed reference clock signal, wherein the delayed reference clock signal is transmitted to a second input of the second phase detector.

10. The digitally controlled delay-locked loop defined in claim 9 wherein a delay of the second delay circuit is twice as long as the delay of the first delay circuit.

11. A delay-locked loop comprising:

a first phase detector that compares a delayed feedback signal and a reference signal;

control logic that generates digital signals in response to an output signal of the first phase detector;

a delay chain generating a delay in a feedback signal that varies in response to the digital signals; and a delay circuit that delays the feedback signal to generate the delayed feedback signal, wherein the delay of the delay chain varies by a discrete time period in response to a change in logic states of the digital signals, and the delay of the delay circuit is less than the discrete time period, and wherein the first phase detector has a zero hold time.

12. The delay-locked loop defined in claim 11 wherein the control logic comprises a counter circuit that adjusts a binary value of the digital signals in one of first and second directions in response to the output signal of the first phase detector.

13. A delay-locked loop comprising:

a first phase detector that compares a delayed feedback signal and a reference signal;

control logic that generates digital signals in response to an output signal of the first phase detector;

a delay chain generating in a feedback signal that varies in response to the digital signals;

a delay circuit that delays the feedback signal to generate the delayed feedback signal, wherein the delay of the delay chain varies by a discrete time period in response to a change in logic states of the digital signals and the delay of the delay circuit is less than the discrete time period; and a second phase detector coupled to receive the delayed feedback signal, wherein the control logic generates the digital signals in response to output signals of the first and the second phase detectors, and the second phase detector has a zero setup time.

14. A delay-locked loop comprising:

a first phase detector that compares phases of a delayed feedback clock signal and a reference clock signal;

control logic that generates digital signals in response to an output signal of the first phase detector;

a delay chain that generates a delay in a feedback clock signal, wherein the delay chain causes the delay in the feedback clock signal to vary by a discrete time period in response to each change in logic states of the digital signals; and a first delay circuit that delays the feedback clock signal by a delay that is less than the discrete time period to generate the delayed feedback clock signal;

a second delay circuit that delays the reference clock signal to generate a delayed reference clock signal; and a second phase detector that compares phases of the delayed feedback clock signal and the delayed reference clock signal.

15. A delay-locked loop comprising:

a first phase detector that compares phases of a delayed feedback clock signal and a reference clock signal;

control logic that generates digital signals in response to an output signal of the first phase detector;

a delay chain that generates a delay in a feedback clock signal, wherein the delay chain causes the delay in the feedback clock signal to vary by a discrete time period in response to each change in logic states of the digital signals; and a delay circuit that delays the feedback clock signal by a delay that is less than the discrete time period to generate the delayed feedback clock signal, wherein the delay of the delay circuit equals 0.75 times the discrete time period.

16. A delay-locked loop comprising:

a phase detector coupled to receive a delayed reference clock signal;

control logic that generates digital signals in response to an output signal of the phase detector;

a delay chain that generates a delay in a feedback clock signal, wherein the delay chain causes the delay in the feedback clock signal to vary by a discrete time period in response to changes in logic states of the digital signals, the delay chain increases the delay generated in the feedback clock signal by the discrete time period in response to each of a first set of changes in the digital signals, and the delay chain decreases the delay generated in the feedback clock signal by the discrete time period in response to each of a second set of changes in the digital signals; and a first delay circuit that delays a reference clock signal by a first delay to generate the delayed reference clock signal, wherein the first delay of the first delay circuit is less than twice the discrete time period.

17. The delay-locked loop defined in claim 16 further comprising:

a second delay circuit that delays the feedback clock signal by a second delay to generate a delayed feedback clock signal, wherein the delayed feedback clock signal is transmitted to the phase detector, and the second delay provided to the delayed feedback clock signal is less than the discrete time period.

18. A method for generating a clock signal using a delay-locked loop, the method comprising:

comparing phases of first and second clock signals to generate an output signal;

generating digital signals in response to the output signal;

delaying the first clock signal to generate a feedback clock signal;

increasing a delay provided to the first clock signal to generate the feedback clock signal by a discrete time period in response to each of a first set of changes in the digital signals;

decreasing the delay provided to the first clock signal to generate the feedback clock signal by the discrete time period in response to each of a second set of changes in the digital signals; and delaying the feedback clock signal by a delay to generate the second clock signal, wherein the delay provided to the feedback clock signal to generate the second clock signal is less than the discrete time period.

* * * * *